US006777731B2

(12) United States Patent
Kreupl (10) Patent No.: US 6,777,731 B2
(45) Date of Patent: Aug. 17, 2004

(54) MAGNETORESISTIVE MEMORY CELL WITH POLARITY-DEPENDENT RESISTANCE

(75) Inventor: Franz Kreupl, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/352,730

(22) Filed: Jan. 27, 2003

(65) Prior Publication Data

US 2003/0142562 A1 Jul. 31, 2003

(30) Foreign Application Priority Data

Jan. 25, 2002 (DE) ......................................... 102 02 903

(51) Int. Cl.$^7$ .............................................. H01L 29/76
(52) U.S. Cl. ........................... 257/295; 257/68; 257/71; 257/296; 257/298; 257/326; 438/3; 438/240
(58) Field of Search ..................... 257/68, 71, 295–314, 257/324–326; 438/3, 240

(56) References Cited

U.S. PATENT DOCUMENTS

| | | | | |
|---|---|---|---|---|
| 5,640,343 A | * | 6/1997 | Gallagher et al. | ........... 365/171 |
| 5,793,697 A | * | 8/1998 | Scheuerlein | ........... 365/230.07 |
| 6,097,625 A | | 8/2000 | Scheuerlein | |
| 6,219,274 B1 | * | 4/2001 | Shimazawa et al. | ........ 365/158 |
| 6,347,049 B1 | * | 2/2002 | Childress et al. | ........... 365/173 |
| 6,359,289 B1 | * | 3/2002 | Parkin | ........................ 257/43 |
| 2002/0001223 A1 | | 1/2002 | Saito et al. | |
| 2003/0072109 A1 | * | 4/2003 | Sharma et al. | ........... 360/324.2 |

FOREIGN PATENT DOCUMENTS

| | | |
|---|---|---|
| DE | 199 38 215 A1 | 2/2001 |
| DE | 101 23 820 C2 | 12/2002 |
| EP | 0 526 897 B1 | 2/1993 |
| WO | 00/70689 | 11/2000 |

OTHER PUBLICATIONS

John G. Simmons: "Electric Tunnel Effect between Dissimilar Electrodes Separated by a Thin Insulating Film", Journal of Applied Physics, vol. 34, No. 9, Sep. 1963, pp. 2582–2590.
John G. Simmons: "Generalized Formula for the Electric Tunnel Effect between Similar Electrodes Separated by a Thin Film", Journal of Applied Physics, vol. 34, No. 6, Jun. 1963, pp. 1793–1803.
R.C. Sousa et al.: "Vertical Integration of a Spin Dependent Tunnel Junction with an Amorphous Si Diode", Applied Physics Letters, vol. 74, No. 25, Jun. 21, 1999, pp. 3893–3895.
M. Guth et al.: "Tunnel Magnetoresistance in Magnetic Tunnel Junctions with a ZnS Barrier", Applied Physics Letters, vol. 78, No. 22, May 28, 2001, pp. 3487–3489.
M.F. Gillies et al.: "Magnetic Tunnel Junctions with Tantalum Oxide Barriers Displaying a Magnetoresistance Ratio of up to 10% at Room Temperature", Applied Physics Letters, vol. 78, No. 22, May 28, 2001, pp. 3496–3498.
P. Rottländer: "Tantalum Oxide as an Alternative Low Height Tunnel Barrier in Magnetic Junctions", Applied Physics Letters, vol. 78, No. 21, May 21, 2001, pp. 3274–3276.

* cited by examiner

Primary Examiner—David Nelms
Assistant Examiner—Andy Huynh
(74) Attorney, Agent, or Firm—Laurence A. Greenberg; Werner H. Stemer; Gregory L. Mayback (57) ABSTRACT

A magnetoresistive tunnel element includes first and second electrodes and a tunnel barrier disposed between the two electrodes, the tunnel barrier having at least two barrier layers made of different barrier materials, the profile of a quantum mechanical barrier height within the tunnel barrier being asymmetrical and the conductivity of the tunnel element, therefore, being dependent on the polarity of a voltage $U_m$ between the two electrodes. Also provided is a magnetoresistive memory cell, a cell array of magnetoresistive memory cells, and a memory device having cell arrays.

22 Claims, 7 Drawing Sheets

MAGNETORESISTIVE MEMORY CELL WITH POLARITY-DEPENDENT RESISTANCE

BACKGROUND OF THE INVENTION

Field of the Invention

The present invention relates to a magnetoresistive tunnel element having a first electrode, a second electrode, and a tunnel barrier disposed between the two electrodes, a first interface being fashioned between the tunnel barrier and the first electrode, and a second interface being fashioned between the tunnel barrier and the second electrode and the magnetoresistive tunnel element having a quantum mechanical barrier height within the tunnel barrier and also an electrical conductivity. It furthermore relates to a magnetoresistive memory cell having a magnetoresistive tunnel element, and to a memory device having magnetoresistive memory cells.

The core of a magnetoresistive memory cell based on the tunnel effect is of a magnetoresistive tunnel element (magnetic tunnel junction element, MTJ element). Such an MTJ element includes two ferromagnetic layers (electrodes hereinafter) on both sides of a nonferromagnetic or dielectric tunnel barrier.

In a magnetoresistive memory cell, the material of the first electrode is typically a hard-magnetic material, for instance, a cobalt-iron alloy. This first electrode, then, functions with a magnetization that is constant in terms of magnitude and direction as reference layer.

The second electrode made of a soft-magnetic material, typically, a nickel-iron alloy, then forms a memory layer. The magnetization of the memory layer is oriented in the same direction as or in the opposite direction to the magnetization of the reference layer, in a manner corresponding to a data content of the memory cell. The memory cell, thus, has two distinguishable magnetization states (unidirectional, oppositely directed) in accordance with its data content.

The frequency of a passage of electrons from one electrode to the other (quantum mechanical tunneling probability) is dependent on the spin polarization of the electrons in the two electrodes. The tunneling probability is higher in the case of unidirectional magnetization of the two electrodes than in the case of oppositely directed magnetization of the two electrodes. From the conductivity of the MTJ element, it is possible to deduce the orientation of the magnetization of the memory layer relative to the magnetization of the reference layer and, thus, the data content of the memory cell.

A magnetoresistive memory cell usually has further components in addition to the MTJ element. In present concepts, by way of example, the reference layer is provided as a partial layer of an artificial antiferromagnet and the magnetization of the reference layer is, thereby, stabilized. Compared with individual hard-magnetic layers, ferromagnetic or antiferromagnetic systems that are coupled to such an extent through the Rudermann-Kittel-Kasuya-Yoshida (RKKY) interaction have an improved thermal and long-term data stability and are less sensitive to interference magnetic fields.

The tunneling probability in an MTJ element is dependent on the thickness of the tunnel barrier (barrier length), the solid-state properties of the material of the tunnel barrier and the two electrodes (barrier height), the state densities of the electrons in the two electrodes, and on a measurement voltage $U_m$ applied between the two electrodes.

Specifically, in accordance with the Bardeen formalism for a tunneling current I between two electrodes on both sides of a tunnel barrier, a dependence on an external field $\Delta F$ results from the summation of the individual occupation states—regulated by the Fermi distribution $f(E)$—in the two electrodes $\nu, \mu$:

$$I(\Delta F) = \frac{2\pi e}{\hbar} \sum_\mu \sum_\nu \left| T_{\mu,\nu} \right|^2 f(E_\mu)(1 - f(E_\nu))\delta(E_\mu - E_\nu - \Delta F) \quad (1)$$

where:
$T_{\mu,\nu}$: matrix element between an occupation state $\Psi\mu$ of the first electrode and an occupation state $\Psi_\nu$ of the second electrode,
E: energy of an occupation state $\Psi$,
f(E): Fermi function.

By introducing the electron state densities N(E), it is possible to convert the formula (1) into an integral form:

$$I(\Delta F) = \frac{2\pi e}{\hbar} \int_{E_{L,\mu}}^{\infty} dE_\mu \int_{E_{L,\nu}}^{\infty} dE_\nu N_\mu(E_\mu) N_\nu(E_\nu) \quad (2)$$
$$|T_{\mu,\nu}|^2 f(E_\mu)(1 - f(E_\nu))\delta(E_\mu - E_\nu - \Delta F)$$

where $E_L$: conduction band minimum of the electrodes.

For small voltages, the matrix elements and the state densities are regarded as virtually independent of impulse and energy of the electrons and are in each case extracted before the integral. Furthermore, the product of two Fermi functions at the critical temperature of 300 K yields a virtually rectangular window. Under these assumptions, with $$R_T = \frac{\hbar}{e^2 N_\mu N_\nu |T_{\mu,\nu}|^2} \quad (3)$$

the following results for the tunneling current $I(\Delta F)$:

$$I(\Delta F) = \frac{e}{R_T} \int_{E_L}^{\infty} dE f(E)(1 - f(E - \Delta F)) \quad (4)$$

$$I(\Delta F) = \frac{e\Delta F}{e^2 R_T \left(1 - \exp\left(\frac{-\Delta E}{k_B T}\right)\right)} \quad (5)$$

In such a case, the matrix element, which can be interrupted as transmission probability for electrons from an initial occupation state through the tunnel barrier to a final occupation state, is proportional to a state density at the Fermi edge, $D(E, U_m)$. For an arbitrary profile of the potential barrier $\Phi(z)$ within the tunnel barrier in dependence on the spatial variable z, the following relationship results according to J. G. Simmons, "Generalized Formula for the Electric Tunnel Effect between Similar Electrodes Separated by a Thin Insulating Film", J. Appl. Phys., Vol. 34, No. 6, 1793–1803, 1963:

$$|T_{\mu,\nu}|^2 \propto D(E, V) = \exp\left(-2 \int_0^d \sqrt{\frac{2m}{\hbar^2}(E_{F,\mu} + \Phi(z) - E)} \, dz\right) \quad (6)$$

According to the approximation according to Wentzel, Kramers and Brillouin (WBK approximation) for simple tunnel barriers without taking account of image potentials, the following results for a matrix element:

$$|T_{\mu,\nu}|^2 \propto D(E, V) \approx \exp\left(-2d\sqrt{\frac{2m}{\hbar^2}\left(E_{F,\mu} + \frac{\Phi\mu - \Phi v}{2} - \left|\frac{eV}{2}\right| - E\right)}\right) \quad (7)$$

Inserted into the derived formula for the tunneling current I, the latter can be developed into a series having the form $I(U_m) = aU_m + bU_m^2 + \ldots$ The magnetoresistive effect, that is to say the dependence of the tunneling current on the relative magnetic polarization, results from the spin-dependent state densities of the electrons, and also the influenceability of the spin-dependent state densities by a magnetic field.

Furthermore, from formula (5) including formula (7), a polarity-independent or virtually polarity-independent current-voltage behavior results at customary tunnel barriers.

Methods for producing tunnel barriers have been described in many places.

P. Rottlander et al. "Tantalum oxide as an alternative low height tunnel barrier in magnetic junctions" in Applied Physics Letters, Vol. 78, No. 21, May 21, 2001, describe a tunnel barrier made of oxidized tantalum (TaOx) with a barrier height of about 0.4 eV.

N. F. Gillies et al. describe in "Magnetic tunnel junctions with tantalum oxide barriers displaying a magnetoresistance ratio of up to 10% at room temperature" in Applied Physics Letters, Vol. 78, No. 22, May 28, 2001, the dependence of barrier height and barrier length on the oxidation time of a tantalum layer having a thickness of 0.8 nm.

For Zns tunnel barriers, barrier heights of 0.58 eV are specified, e.g., in N. Guth, H. A. M. van den Berg et al. "tunnel magnetoresistance in magnetic tunnel junctions with a Zns barrier", Applied Physics Letters, Vol. 78, No. 22, May 28, 2001.

Further customary materials for tunnel barriers are $Al_2O_3$, NiO, MgO, $HfO_2$, and $SrTiO_3$, with customary barrier heights of between 1.0 eV and 2.3 eV.

As already described, MTJ elements are part of magnetoresistive memory cells that are disposed in matrix form in magnetic memory devices (magnetic random access memories, MRAMs).

Figure 2:
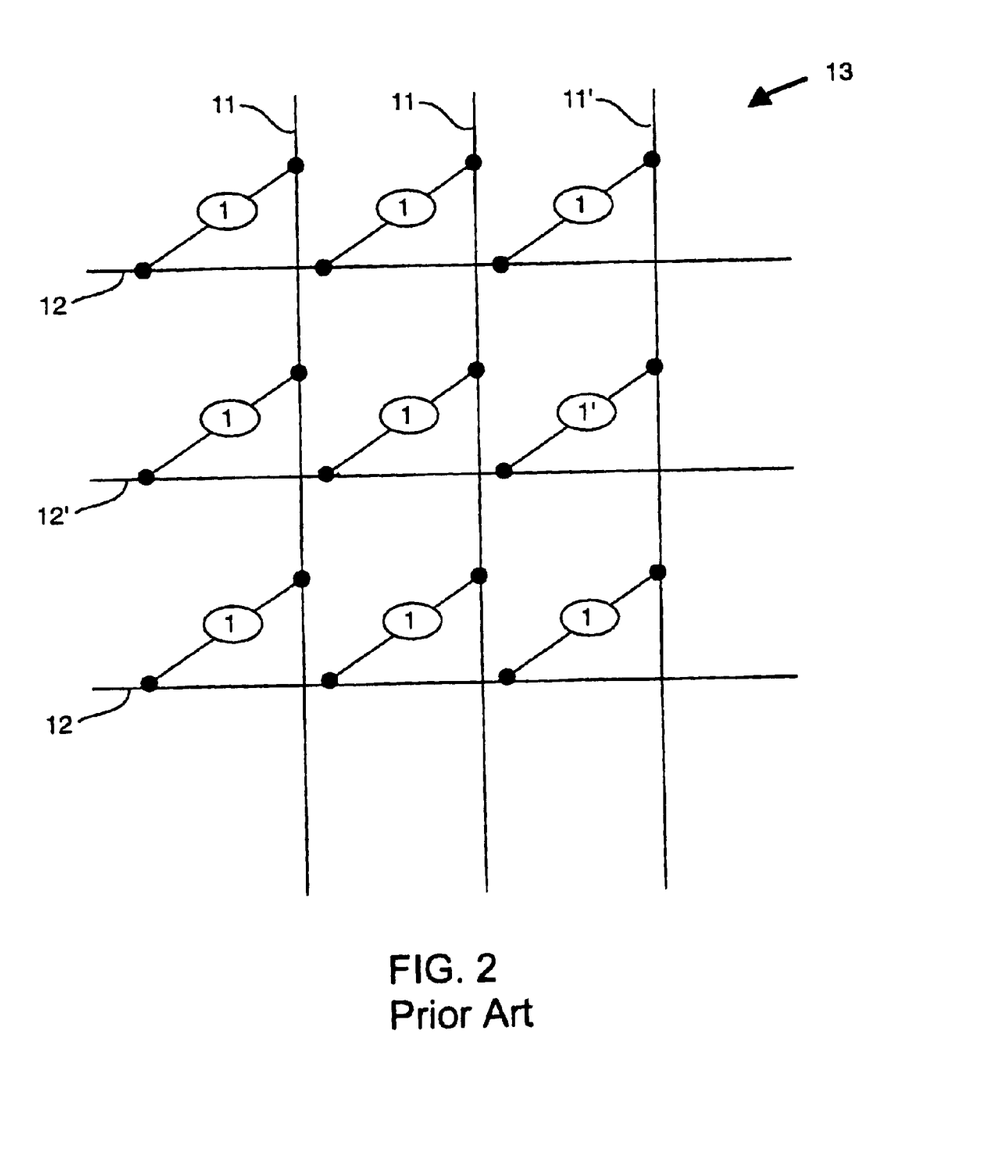
FIG. 2 is a fragmentary block circuit diagram of a prior art memory cell array.

One portion of a memory cell array 13 of a plurality of memory cell arrays 13, each memory cell array 13 having a plurality of magnetoresistive memory cells 1, is illustrated diagrammatically in FIG. 2. In this case, each memory cell 1 is disposed between a bit line 11 and a word line 12. A memory cell 1' is written to by a suitable current being controlled simultaneously in the bit line 11' and the word line 12'. At the location of the selected memory cell 1', the magnetic fields of the two write currents are superposed and bring about an orientation of the magnetization of the memory layer of the memory cell 1'. The magnetization in the memory layers of the nonselected or only partially selected memory cells 1 remains unchanged.

To read out the data content of the memory cell 1', a read current, which is small relative to the write current, is passed in a similar manner through the bit line 11' and the word line 12' and the voltage drop across the magnetoresistive memory cell 1' is measured.

Figure 3A:
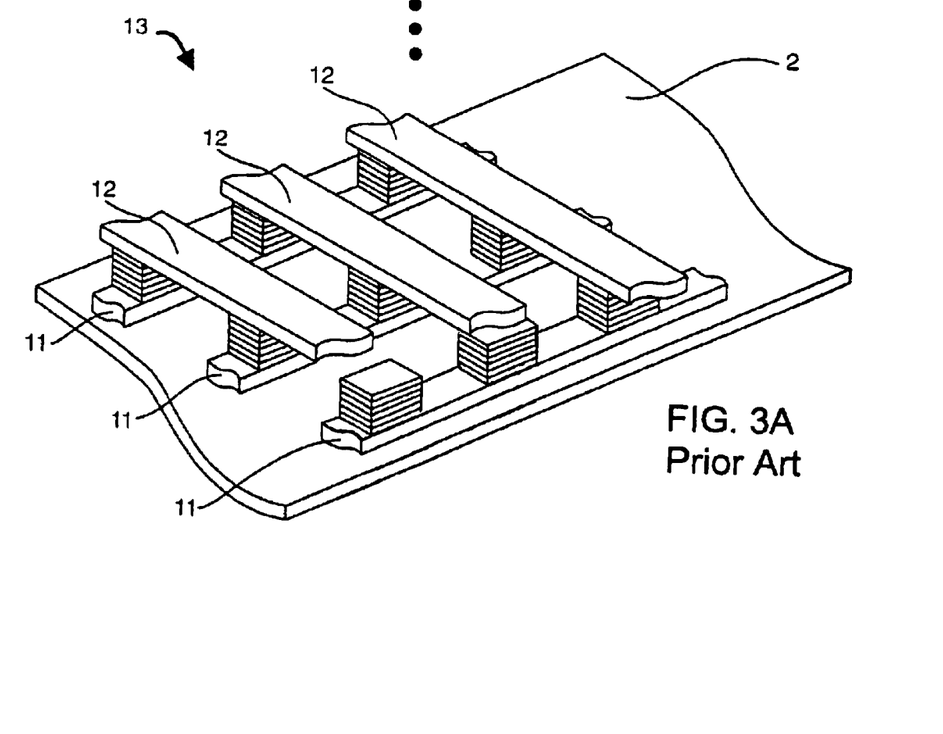
FIG. 3A is a fragmentary perspective illustration of a prior art memory cell array with resistive memory cells.
Figure 3B:
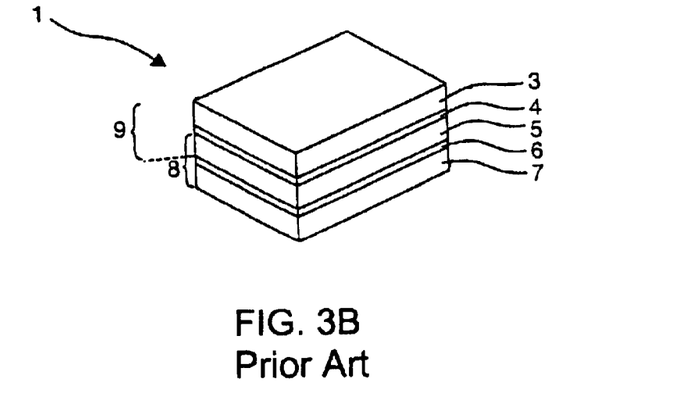
FIG. 3B is an enlarged perspective view of a memory cell of FIG. 3A.

FIGS. 3A and 3B shows a detail from such a memory cell array 13 in a simplified three-dimensional illustration. In this case, the bit lines 11 are provided on a substrate 2 in a first interconnect layer and the word lines 12 are provided in a second interconnect layer. The magnetoresistive memory cells 1 are disposed at the crossover points in each case between a bit line 11 and a word line 12 in a region between the two interconnect layers.

In the example depicted in FIG. 3B, each memory cell 1 includes a layer stack, formed from a memory layer 3, a tunnel barrier 4, and a reference layer 5. The memory layer 3, the tunnel barrier 4, and the reference layer 5 together form an MTJ element 9. In this example, the reference layer 5 is, furthermore, a partial layer of an artificial antiferromagnet 8, which is additionally formed by a further ferromagnetic partial layer 7 and a spacer layer (spacer) 6 disposed between the two ferromagnetic layers 5 and 7. The magnetization of the reference layer 5 is fixedly coupled to the magnetization of the ferromagnetic partial layer 7 through the spacer 6.

In the present-day prior art, the difference in resistance for the two magnetization states in MTJ memory cells is typically 15 to 40%. The resistance of two adjacent memory cells in a memory cell array may amount to 20% given the same magnetization. Consequently, the conductivity of two memory cells having the same magnetization differs by the same order of magnitude as that of two magnetization states of a single memory cell.

Furthermore, the evaluation of the magnetization state and, thus, an assessment of the data content of a memory cell is made considerably more difficult by the fact that, during the read-out operation of a selected memory cell, the set of all nonaddressed or only partially addressed memory cells acts as a parasitic, parallel resistance network.

The outlay required for the conditioning and assessment of the measurement signal is associated with longer access times to the data content of the memory cell.

One possibility for accelerating the read-out operation lies in inserting a transistor in series with the MTJ element. During read-out, the access selectivity is increased by the transistor because the transistors in the memory cells disposed in parallel are in the off state. However, a memory cell structure with transistors in each case requires an additional line for driving the transistor, and also a considerable additional outlay for the configuration of the transistor, for instance, in a region respectively associated with a memory cell in a substrate disposed beneath the memory cell array.

A further possibility for increasing the selectivity of the addressing during the read-out operation is a diode or diode-like device disposed in series with the MTJ element. If the diode devices are disposed with the same polarity relative to bit line and word line in all the memory cells, then, there is always at least one diode in the reverse direction in each parasitic parallel path. The parallel paths, thus, acquire considerably higher resistance through the parasitic resistance matrix and the selectivity of the addressing is significantly increased.

U.S. Pat. No. 5,640,343 to Scheuerlein et al. describes a memory cell in which, in series with an MTJ element, a diode in conventional technology is provided in a region between bit line and word line. In such a case, the diode is provided in two layers made of semiconductor materials.

What is disadvantageous about a diode according to Scheuerlein is the inadequate adaptation and a lack of self-scaling of the diode properties to the dimensions and the operating point of the MTJ element. Furthermore, for the same read voltage, a diode disposed in such a way or similarly reduces the voltage drop across the tunnel element and impairs the distinguishability of the two polarization states.

U.S. Pat. No. 6,097,625 to Scheuerlein et al. (hereinafter "Scheuerlein II") proposes a diode in the substrate beneath the memory cell region.

What is disadvantageous about a diode in accordance with Scheuerlein II, besides a generally increased fabrication outlay, is the complicated mixing of the silicon technology of the substrate diode with the fabrication processes for producing the magnetoresistive layer stack. Furthermore, a realization of the diode in the substrate precludes a stacking of memory cell arrays in a vertical direction with respect to the substrate surface.

The same applies to the diode made of hydrogenated amorphous silicon described in R. Sousa, "Vertical Integration of a Spin Dependent Tunnel Junction with an Amorphous Si Diode" in Applied Physics Letters, Vol. 74, No. 25, Jun. 21, 1999. For an operating voltage that is typically less than about 1 V, such a diode has high resistance and reduces the measurement current. A smaller measurement current leads to reduced interference immunity and slows down the read operation. Reducing the diode resistance by a larger diode area is at odds with the area requirement.

J. G. Simmons, "Electric Tunnel Effect between Dissimilar Electrodes Separated by a Thin Insulating Film", J. Appl. Phys. vol. 34, No. 9, 2581–2590, 1963, described an asymmetrical MTJ element (metal-insulator-metal junction, MIM) whose conductivity depends on the magnitude and polarity of a potential $U_m$ applied between the two metals. A simplifying, clear explanation of this is illustrated diagrammatically in the drawings of FIGS. 4A, 4B, and 4C.

Figure 4A:
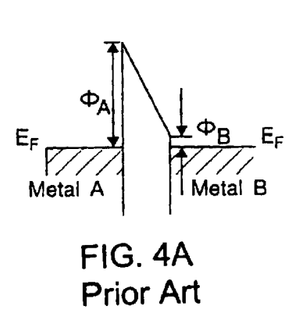
FIG. 4A is a fragmentary, diagrammatic energy band diagram of a prior art metal-insulator-metal junction with a greatly asymmetrical barrier.
Figure 4B:
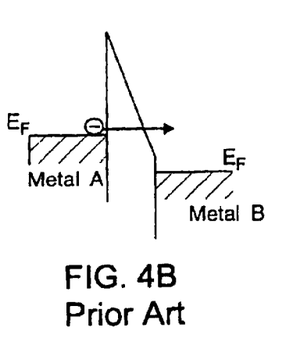
FIG. 4B is a fragmentary, diagrammatic energy band diagram of a prior art metal-insulator-metal junction with a greatly asymmetrical barrier different from FIG. 4A.
Figure 4C:
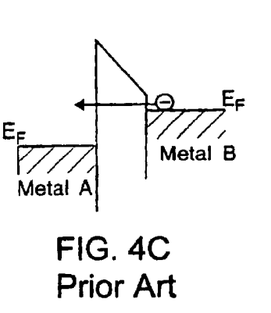
FIG. 4C is a fragmentary, diagrammatic energy band diagram of a prior art metal-insulator-metal junction with a greatly asymmetrical barrier different from FIG. 4A.

FIGS. 4A to 4C show diagrammatic energy diagrams of a metal-insulator-metal junction with a greatly asymmetrical barrier for different potentials $U_m$ between the electrodes metal A and metal B. In such a case, the metals A and B have different work functions.

In the quiescent state $U_m=0$, the Fermi level $E_F$ is established at the same level in both metals A and B, as shown in FIG. 4A. On account of the different work functions, different barrier heights $\Phi_A$ and $\Phi_B$ result at the two interfaces between insulator and metal. The profile of the barrier height within the tunnel barrier is assumed to be linear to a simplifying approximation.

If a voltage $U_m$, where $eU_m > \Phi_B$, is, then, applied between the electrodes metal A and metal B, as shown in FIG. 4B, there is a reduction, as indicated, in an effective barrier length for electrons at the Fermi edge in the electrode metal A so that the tunneling probability and, thus, the current flow increases.

If the polarity of the applied voltage is interchanged, as shown in FIG. 4C, then, by contrast, the effective barrier length does not change for electrons at the Fermi edge of the electrode metal B. Compared with the state from FIG. 4B, the tunneling probability remains lower to a first approximation.

Such a configuration has a polarity-dependent change in conductivity on account of the different work functions of the two electrodes. For the application in magnetoresistive memory cells, however, the selection of the materials for the two electrodes is greatly limited. The selection is based on other criteria such as, for instance, the ratio of the coercive field strengths, thermal stability, or the layer roughness that can be achieved. The customary ferromagnetic materials for the two electrodes of the MTJ element are cobalt- and nickel-iron alloys, whose work functions differ only slightly from one another.

SUMMARY OF THE INVENTION

It is accordingly an object of the invention to provide a magnetoresistive memory cell with polarity-dependent resistance that overcomes the hereinafore-mentioned disadvantages of the heretofore-known devices of this general type and that provides a configuration for an MTJ element in which:

the conductivity between the two electrodes of the MTJ element depends to more than a slight extent on the polarity of a measurement voltage applied between the two electrodes; and a magnetoresistive effect in a tunnel barrier of the MTJ element is not reduced or is reduced to not more than a slight extent, and the production of which can be combined with the process technology of the MTJ element in a simple manner.

Furthermore, the invention provides a configuration for a magnetoresistive memory cell in which:

the selectivity of the addressing of the memory cell in a memory cell array having a multiplicity of memory cells by word and bit lines is increased compared with only resistive memory cell arrays, and memory cell arrays can be stacked in a simple manner in a direction perpendicular to a memory cell plane.

With the foregoing and other objects in view, there is provided, in accordance with the invention, a magnetoresistive tunnel element, including a first electrode, a second electrode, a tunnel barrier having a quantum mechanical barrier height therewithin, the tunnel barrier being disposed between the first and second electrodes and defining a first interface between the tunnel barrier and the first electrode and a second interface between the tunnel barrier and the second electrode, and the tunnel barrier including the first and second interfaces defining a profile of the quantum mechanical barrier height within the tunnel barrier, the profile being asymmetrical with regard to a barrier symmetry area equidistant from the first and second interfaces, and the tunnel barrier and the first and second electrodes defining a tunnel element having an electrical conductivity dependent upon a polarity of a measurement voltage $U_m$ applied between the first and second electrodes.

With the objects of the invention in view, there is also provided a magnetoresistive tunnel element, including a first electrode, a second electrode, a tunnel barrier having a quantum mechanical barrier height therewithin, the tunnel barrier being disposed between the first and second electrodes and defining a first interface between the tunnel barrier and the first electrode and a second interface between the tunnel barrier and the second electrode, a profile of the quantum mechanical barrier height within the tunnel barrier with inclusion of the first and second interfaces being asymmetrical with regard to a barrier symmetry area equidistant from the first and second interfaces, and the tunnel barrier and the first and second electrodes defining a tunnel element having an electrical conductivity dependent upon a polarity of a measurement voltage $U_m$ applied between the first and second electrodes.

Thus, in a configuration of the type according to the invention, in an MTJ element including two electrodes and a tunnel barrier lying in between, the tunnel barrier is fashioned such that different tunneling probabilities result when a potential difference is applied between the two electrodes, depending on the polarity of the potential difference. The different tunneling probabilities lead to a polarity-dependent, diode-like resistance behavior of the MTJ element.

A tunnel barrier with a polarity-dependent tunneling probability results, for instance, in the case of an asymmetrical profile of the barrier height. In such a case, the asymmetry relates to a barrier symmetry area equidistant from the interfaces respectively situated between the tunnel barrier and the two electrodes, the interfaces being concomitantly included in the asymmetry consideration.

It is understood to the person skilled in the art that, in principle, in every real tunnel barrier, the barrier height may have a more or less asymmetrical profile in the abovementioned sense. This results for instance from the use of different materials with work functions that differ slightly from one another for the two electrodes. Furthermore, the real profile of the barrier height within the tunnel barrier is influenced inter alia by impurity atoms, surface states, or the surface roughness. These process-dictated, parasitic and usually slight proportions of asymmetries of the barrier profile are difficult to describe and hardly able to be controlled process-technologically.

A clear demarcation should be drawn between the latter and a real tunnel barrier in which the barrier profile is fashioned by a defined configuration or a controlled fabrication method in a targeted manner to more than a slight extent in asymmetrical form.

Such a tunnel barrier with a polarity-dependent conductivity is referred to below as an asymmetrical tunnel barrier (ATB).

A simple asymmetrical tunnel barrier (ATB) lies in a configuration including a first electrode made of a first ferromagnetic material with a work function $W_A$ and a second electrode made of a second ferromagnetic material with a work function $W_B$, which differs significantly, that is to say, by more than 0.5 eV but less than 50 eV, from the work function $W_A$.

The further use of an MTJ element, for example, in a magnetoresistive memory cell, results in further selection criteria for the electrodes forming a reference layer and a memory layer so that the work functions of the materials of the electrodes usually differ only slightly from one another.

In accordance with another feature of the invention, therefore, an ATB is obtained through a tunnel barrier including at least two barrier sections made of at least two different barrier materials. In such a case, the barrier materials are chosen such that the work functions of the barrier materials differ by at least 0.1 eV. For a maximum polarity-dependent difference in conductivity, the barrier sections are disposed such that an asymmetrical profile of the barrier height is established. To that end, the barrier sections are disposed asymmetrically with respect to a barrier symmetry area. The barrier symmetry area results as an area equidistant from the two interfaces.

Electrodes and barrier sections may be fashioned differently. In accordance with a further feature of the invention, the electrodes and the barrier sections are in each case fashioned as layers. Such layers can be produced in a particularly simple manner by customary methods of wafer processing (sputtering, vapor phase deposition, etc.).

Because the tunneling probability decreases to a very great extent with the barrier length, the total thickness of the tunnel barrier is also limited to a few nanometers. Furthermore, because the process control becomes more difficult as the layer thickness decreases and parasitic effects (for instance, contaminants, surface states, surface roughness) increase more than proportionally in the case of very thin layers, it is advantageous to limit the number of barrier layers to two.

In accordance with an added feature of the invention, the first and second electrodes and the at least two barrier sections are respectively provided as planar barrier layers disposed successively on one another, one of the first and second electrodes being disposed as a bottom one of the barrier layers and another of the first and second electrodes being disposed as a top one of the barrier layers.

In accordance with an additional feature of the invention, the tunnel barrier has a first barrier layer having a layer thickness $d_a$ of a first barrier material with a work function $W_{Ta}$ and a second barrier layer having a layer thickness $d_b$ of a second barrier material with a work function $W_{Tb}$.

In accordance with yet another feature of the invention, the tunnel barrier has a first barrier layer having a layer thickness $d_a$ of a first barrier material with a given work function and a second barrier layer having a layer thickness $d_b$ of a second barrier material with a work function different from the given work function.

Suitable barrier materials are dielectrics such as metal oxides, mixed metal oxides, and metal sulfides, which can be applied or produced in thin layers in a particularly suitable manner in the context of the customary fabrication technology for magnetoresistive memory cells. In such a case, usually the metal proportion is applied by sputtering and, then, is oxidized with oxygen or sulfur under controlled conditions. If the metal forms a plurality of oxidation stages, then it is also possible for a plurality of oxidation stages of the metal to be present in the relevant barrier layer. In such a case, the work function of a barrier layer may depend on the relative quantities of the different oxidation stages with respect to one another. It, then, results to a certain extent from the oxidation time and the process variables during oxidation.

In accordance with yet a further feature of the invention, the barrier materials are materials selected from a group consisting of aluminum oxides, tantalum oxides, hafnium oxides, nickel oxides, magnesium oxides, strontium titanium oxides, and zinc sulfide.

Because the total thickness of the tunnel barrier is limited to a few nanometers and, furthermore, parasitic effects such as, for instance, contaminants, surface states, and surface roughness increasingly influence the tunneling mechanism in the case of very thin layers, it is advantageous to embody both barrier layers with approximately the same layer thickness. Therefore, in accordance with yet an added feature of the invention, the tunnel barrier is provided in the form of two barrier layers made of different barrier materials that are deposited with approximately the same layer thickness in each case.

In accordance with yet an additional feature of the invention, the electrodes of the MTJ element include a cobalt-iron alloy or a nickel-iron alloy with approximately the same work functions in each case. The tunnel barrier includes two barrier layers each having a thickness of 1 nm. The material of one barrier layer is aluminum oxide, and the material of the other barrier layer is tantalum oxide. A barrier height of 2.8 eV is established at the interface between one electrode and the barrier layer made of aluminum oxide, and a barrier height of 0.28 eV is established at the interface between the other electrode and the barrier layer made of tantalum oxide.

For an MTJ element with an edge length of 200 nm, a plurality-dependent change in the conductivity by about the factor 10 results computationally for voltages $|U_m|>0.8$ V. Such an MTJ element is particularly suitable for a magnetoresistive memory cell, the addressing of which in a resistive memory cell structure is, then, significantly more selective compared with memory cells with conventional MTJ elements.

In accordance with again another feature of the invention, the electrodes of the MTJ element, again, include a cobalt-iron alloy or nickel-iron alloy and the tunnel barrier includes two barrier layers each having a thickness of 2.5 nm. The material of one barrier layer is zinc sulfide, and the material of the other barrier layer is tantalum oxide. A barrier height of 1.0 eV is established at the interface between one electrode and the barrier layer made of zinc sulfide, and a barrier height of 0.28 eV is, again, established at the interface between the other electrode and the barrier layer made of tantalum oxide.

For an MTJ element with an edge length of 200 nm, a polarity-dependent change in the conductivity by about the factor 1000 results computationally for voltages $|U_m|>1.3$ V.

Magnetoresistive memory cells having MTJ elements of the type according to the invention, one of the two electrodes being disposed as memory layer and the other electrode being disposed as reference layer, can be operated with greater interference immunity and/or at higher speeds.

The illustration and description of such an MTJ element is limited to the illustration of two ferromagnetic layers as electrodes and one or more dielectric layers as tunnel barrier. However, it is understood to the person skilled in the art that, in such a case, the memory cell may have still further dielectric, ferromagnetic, or nonferromagnetic layers, including in the region of the MTJ element. Such layers, including nonferromagnetic layers may be provided, for instance, for controlling the roughness of the interfaces on both sides of the tunnel barrier.

In accordance with again a further feature of the invention, memory cells of the type according to the invention are disposed completely in the region between two interconnect layers, the memory cells being addressed, written to, and read from through the interconnect layers. Such a configuration is particularly advantageous because such a structure can be disposed three-dimensionally in a particularly simple manner.

Stacking a plurality of memory cell planes including the associated interconnect layers produces a memory device with a particularly high density of memory cells.

With the objects of the invention in view, there is also provided a magnetoresistive memory cell, including a memory layer defining a first electrode, a reference layer defining a second electrode, and a magnetoresistive tunnel element having a tunnel barrier having a quantum mechanical barrier height therewithin, the tunnel barrier being disposed between the first and second electrodes and defining a first interface between the tunnel barrier and the first electrode and a second interface between the tunnel barrier and the second electrode, and the tunnel barrier including the first and second interfaces defining a profile of the quantum mechanical barrier height within the tunnel barrier, the profile being asymmetrical with regard to a barrier symmetry area equidistant from the first and second interfaces, and the tunnel barrier and the first and second electrodes defining a tunnel element having an electrical conductivity dependent upon a polarity of a measurement voltage $U_m$ applied between the first and second electrodes.

With the objects of the invention in view, there is also provided a memory cell array, including magnetoresistive memory cells each having a memory layer defining a first electrode, a reference layer defining a second electrode, and a magnetoresistive tunnel element having a tunnel barrier having a quantum mechanical barrier height therewithin, the tunnel barrier being disposed between the first and second electrodes and defining a first interface between the tunnel barrier and the first electrode and a second interface between the tunnel barrier and the second electrode, and the tunnel barrier including the first and second interfaces defining a profile of the quantum mechanical barrier height-within the tunnel barrier, the profile being asymmetrical with regard to a barrier symmetry area equidistant from the first and second interfaces, and the tunnel barrier and the first and second electrodes defining a tunnel element having an electrical conductivity dependent upon a polarity of a measurement voltage $U_m$ applied between the first and second electrodes, a first interconnect layer having word lines respectively connected to the magnetoresistive memory cells, a second interconnect layer having bit lines respectively connected to the magnetoresistive memory cells, and the magnetoresistive memory cells disposed between the first interconnect layer and the second interconnect layer.

With the objects of the invention in view, there is also provided a memory device, including memory cell arrays each having magnetoresistive memory cells each having a memory layer defining a first electrode, a reference layer defining a second electrode, and a magnetoresistive tunnel element having a tunnel barrier having a quantum mechanical barrier height therewithin, the tunnel barrier being disposed between the first and second electrodes and defining a first interface between the tunnel barrier and the first electrode and a second interface between the tunnel barrier and the second electrode, and the tunnel barrier including the first and second interfaces defining a profile of the quantum mechanical barrier height within the tunnel barrier, the profile being asymmetrical with regard to a barrier symmetry area equidistant from the first and second interfaces, and the tunnel barrier and the first and second electrodes defining a tunnel element having an electrical conductivity dependent upon a polarity of a measurement voltage $U_m$ applied between the first and second electrodes, a first interconnect layer having word lines respectively connected to the magnetoresistive memory cells, a second interconnect layer having bit lines respectively connected to the magnetoresistive memory cells, and the magnetoresistive memory cells disposed between the first interconnect layer and the second interconnect layer, and the memory cell arrays and the first and second interconnect layers form memory structures stacked one above the other.

Other features that are considered as characteristic for the invention are set forth in the appended claims.

Although the invention is illustrated and described herein as embodied in a magnetoresistive memory cell with polarity-dependent resistance, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
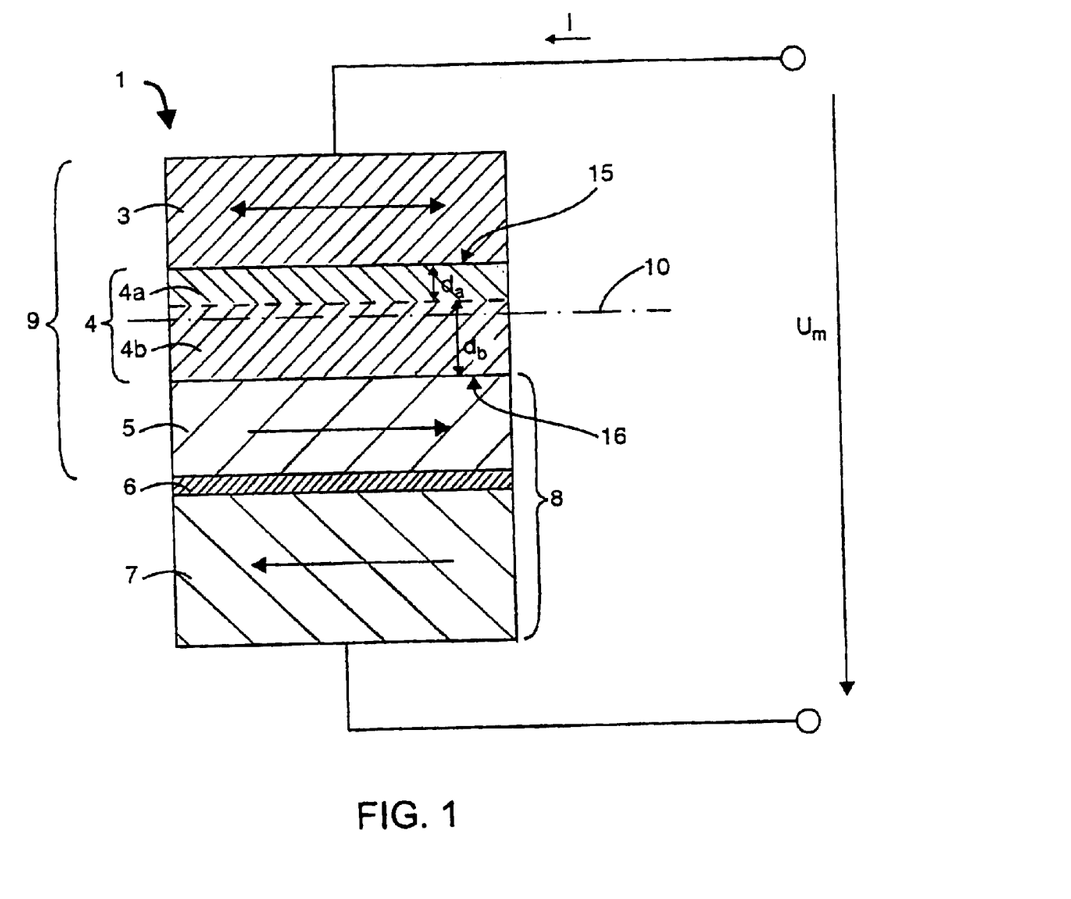
FIG. 1 is a diagrammatic illustration of a first exemplary configuration for a magnetoresistive memory cell according to the invention.

Referring now to the figures of the drawings in detail and first, particularly to FIG. 1 thereof, there is shown a magnetoresistive memory cell 1 with an MTJ element 9. The MTJ element 9 is formed by a first electrode, the memory layer 3, and a second electrode, the reference layer 5, on both sides of a tunnel barrier 4. The reference layer 5 is disposed with a spacer 6 and a further ferromagnetic partial layer 7 to form an artificial antiferromagnet 8.

The magnetization of the reference layer 5, indicated by an arrow in the layer 5, is fixedly coupled to the magnetization of the ferromagnetic partial layer 7 (also indicated by an arrow in the layer 7). The magnetization direction of the memory layer 3 is directed in the same direction as or in the opposite direction to the magnetization of the reference layer 5, depending on a data content of the memory cell 1. The material of the memory layer 3 forming a first electrode of the MTJ element 9 is a nickel-iron alloy, and the material of the reference layer 5 forming a second electrode of the MTJ element 9 is a cobalt-iron alloy. The work functions of the two alloys depend on the respective degree of alloying. The work functions usually differ by less than 0.1 eV. In this exemplary embodiment, a common value $W_M$ for the work function is assumed for both materials.

The material of the ferromagnetic partial layer 7 is, likewise, a cobalt-iron alloy and the material of the spacer 6 is rubidium.

The tunnel barrier 4 includes a first barrier layer 4a and a second barrier layer 4b, which have layer thicknesses $d_a$ and $d_b$ in the illustrated embodiment of the invention. The dielectric material of the first barrier layer 4a has the work function $W_a$ and the, likewise, dielectric material of the barrier layer 4b has the work function $W_b$. The work functions $W_a$ and $W_b$ differ by about 1 eV, where $W_a < W_b$.

If a measurement voltage $U_m$ is applied to the memory cell 1 between the ferromagnetic partial layer 7 and the memory layer 3, then a current I flows through the memory cell, which current is determined by the tunneling current between the two electrodes 3, 5 of the MTJ element 9.

The tunneling current is a function of the state densities of the electrons at the Fermi edge in the two electrodes and the magnitude of the measurement voltage $U_m$.

The state density of the electrons is dependent on the spin polarization of the electrons. The spin polarization of the electrons is, in turn, dependent on the direction of magnetization in the respective electrode.

Moreover, the tunneling current I is dependent on the polarity of the measurement voltage $U_m$. A condition for this is that the profile of the barrier height in a direction perpendicular to the interfaces 15, 16 is asymmetrical relative to a barrier symmetry area 10 in the center of the tunnel barrier 4.

Figure 5A:
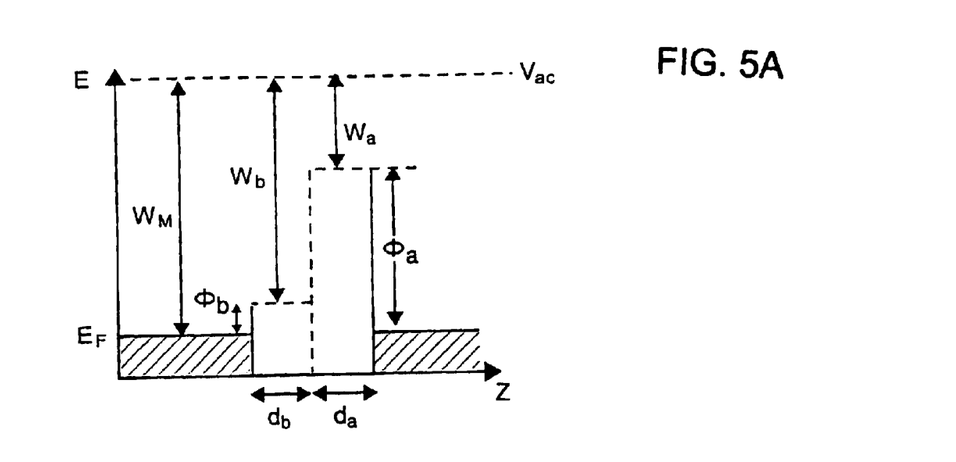
FIG. 5A is a fragmentary, energy band diagram for an MTJ element according to a second exemplary embodiment of the invention.
Figure 5B:
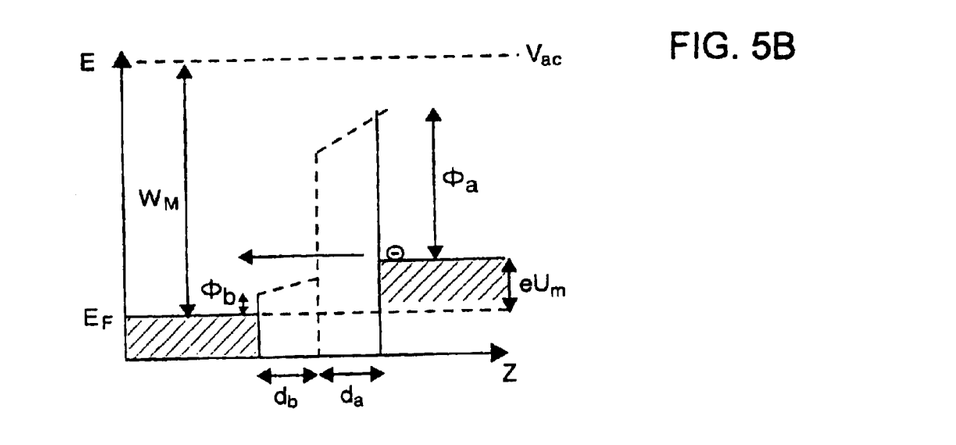
FIG. 5B is a fragmentary, energy band diagram for an MTJ element according to the second embodiment of FIG. 5A.
Figure 5C:
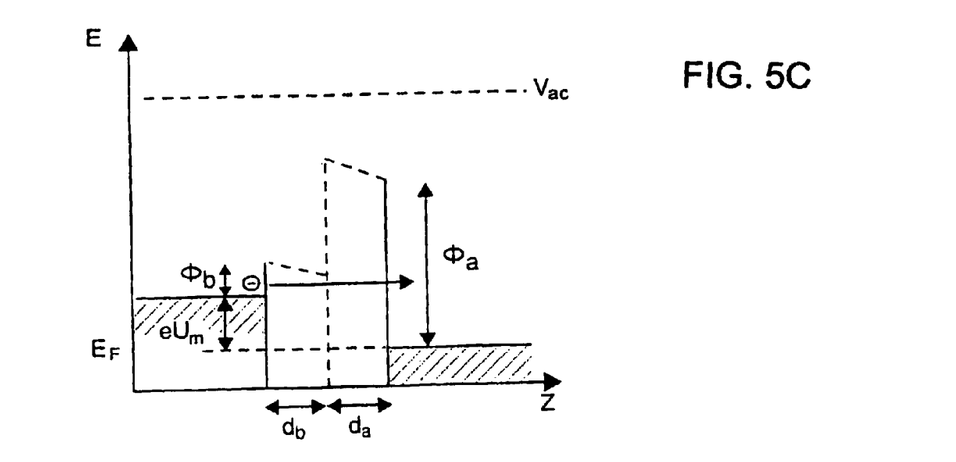
FIG. 5C is a fragmentary, energy band diagram for an MTJ element according to the second embodiment of FIG. 5A.

The polarity dependence of the tunneling current I of the configuration illustrated in FIG. 1 is illustrated in the diagrammatic energy band diagram illustrated in FIGS. 5A, 5B, and 5C. The diagrams are a simplification that only roughly reflects the actual conditions and, primarily, serves for illustrating the functional principle.

To that end, FIG. 5A shows the energy band diagram of the configuration illustrated in FIG. 1 in the equilibrium state with $U_m=0$. The Fermi level $E_F$ is approximately the same in both electrodes. The barrier height $\Phi_a$ at the interface between the first electrode or memory layer 3 and the barrier layer 4a results from the difference between the work functions $W_M$ and $W_a$ of the materials of the two layers 3, 4a. The barrier height $\Phi_b$ results in the same way from the difference between the work functions $W_M$ and $W_b$.

In FIG. 5B, a measurement voltage $U_m > 0$, where $eU_m > \Phi_b$, is applied between the first electrode 3 and the second electrode 5.

The Fermi level in the first electrode is raised by this magnitude, which can be interrupted as a reduction of the work function by $eU_m$ at the interface between the first electrode 3 and the first barrier height 4a. Because the barrier height in the barrier layer 4b falls below the Fermi level in the first electrode, in a clear consideration, a reduced effective barrier length acts for electrons in the first electrode with an energy at the Fermi level. A shorter barrier length leads to a higher tunneling current. The conductivity is increased compared with a configuration with a uniform barrier height $\Phi_a$.

In FIG. 5C, a measurement voltage $U = -U_m$ is applied between the first electrodes 3 and the second electrode 5.

In such a case, the Fermi level in the second electrode is raised by this magnitude, which can, again, be interrupted as a reduction of the work function by $eU_m$ at the interface between the second electrode 5 and the second barrier layer 4b. Because the barrier height is maintained at the interface between the barrier layer 4b and the second electrode 5, in a clear consideration, the barrier length is maintained for electrons in the second electrode with an energy at the Fermi level. The conductivity corresponds rather to that in a configuration with a uniform barrier height $\Phi_a$.

Figure 6:
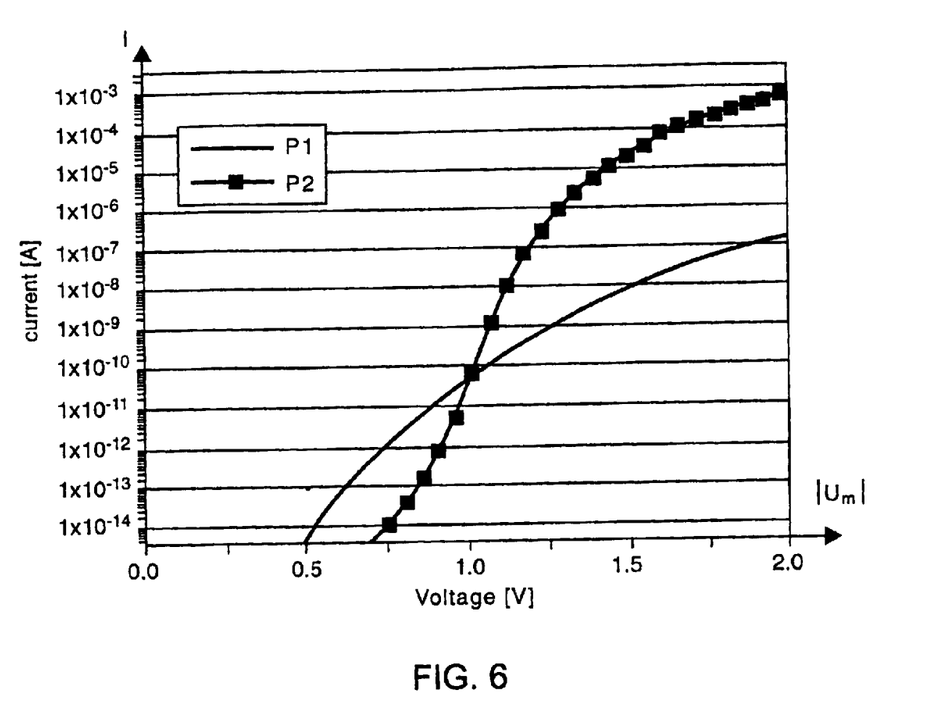
FIG. 6 is a graph illustrating calculated current-voltage characteristic curves for an MTJ element of a third exemplary embodiment according to the invention.

The current-voltage diagram of FIG. 6 illustrates the calculated tunneling current I as a function of magnitude and polarity of a measurement voltage $U_m$ for a third exemplary embodiment of the invention.

In such a case, the MTJ element has a square cross-section with an edge length of 200 nm. The tunnel barrier includes two barrier layers each having a thickness of 2.5 nm and made of zinc sulfide ZnS and tantalum oxide TaOx, respectively. The degree of oxidation of the tantalum oxide layer and, thus, the work function for the layer depend on the process conditions under which the layer is produced. The work functions for the two barrier layers and the electrodes produce a barrier height of 1 eV at the interface between one electrode and the barrier layer made of zinc sulfide and a barrier height of 0.28 eV at the interface between the other electrode and the barrier layer made of TaOx.

Below a crossover voltage of about 1 V, tunneling currents that differ from one another by up to a factor of 100 result for the two polarities P1 and P2 of the measurement voltage $U_m$.

Above the crossover voltage, tunneling currents that differ from one another by up to a factor of 1000 result depending on the polarity of the measurement voltage $U_m$.

At the crossover voltage, the preferred direction of the tunneling current changes in such a case.

Figure 7A:
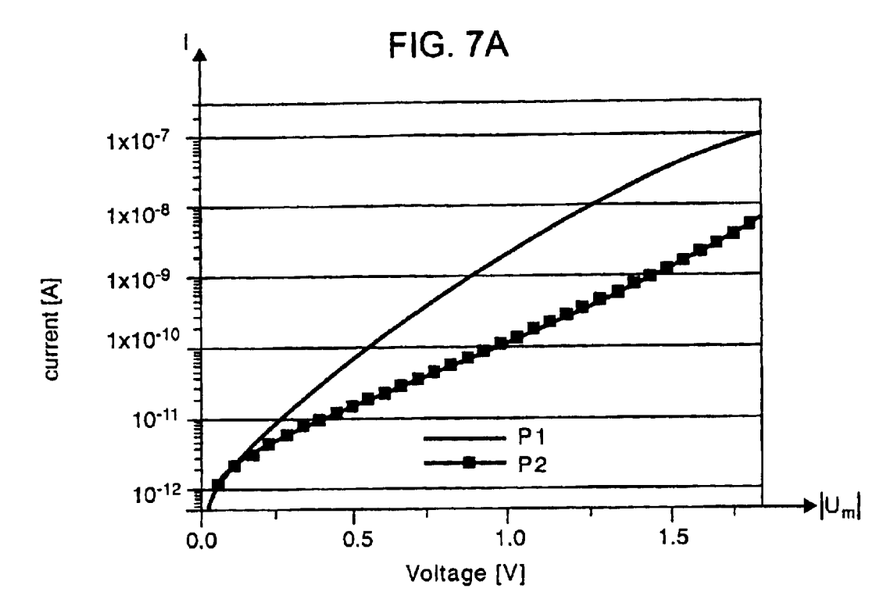
FIG. 7A is a logarithmic graph of a calculated current-voltage characteristic curve for an MTJ element of a fourth exemplary embodiment according to the invention.
Figure 7B:
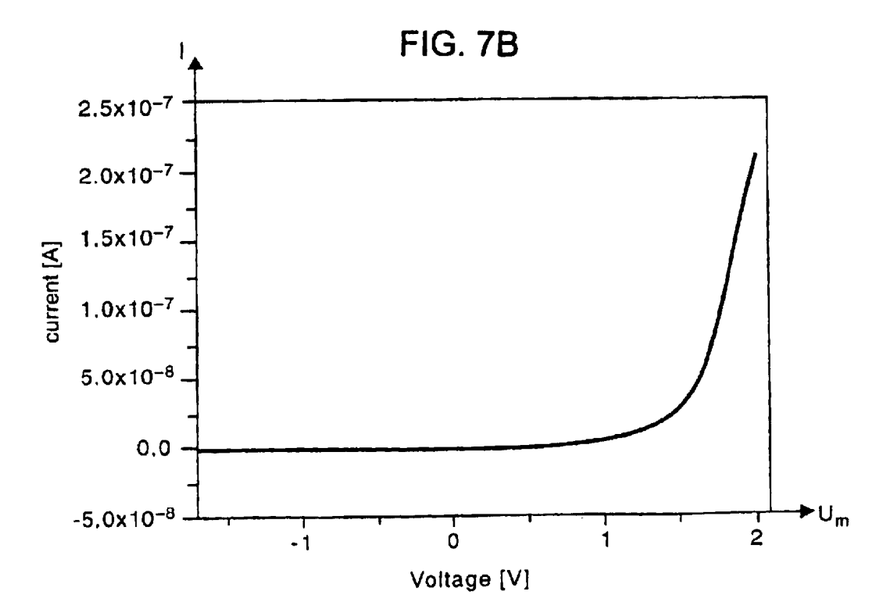
FIG. 7B is a linear graph of the calculated current-voltage characteristic curve of FIG. 7A.

The two current-voltage diagrams of FIGS. 7A and 7B illustrate the calculated tunneling current as a function of magnitude and polarity of a measurement voltage $U_m$ for a second exemplary embodiment of the invention. In such a case, FIG. 7A shows the relationship on a logarithmic scale and FIG. 7B shows the same relationship on a linear scale.

In such a case, the MTJ element has a square cross-section with an edge length of 200 nm. The tunnel barrier includes two barrier layers each having a thickness of 1.5 nm and made of aluminum oxide AlxOy and tantalum oxide TaOx, respectively.

The work functions for the two barrier layers and the electrodes produce a barrier height of 2.8 eV at the interface between one electrode and the barrier layer made of aluminum oxide and a barrier height of 0.28 eV at the interface between the other electrode and the barrier layer made of TaOx.

In the case of a polarity of the applied measurement voltage $U_m$ in the preferred direction, a tunneling current that is increased by the factor 10 results starting from about 1 V.

I claim:

1. A magnetoresistive tunnel element, comprising:
   a first electrode;
   a second electrode;
   a tunnel barrier having a quantum mechanical barrier height therewithin, said tunnel barrier being disposed between said first and second electrodes and defining:
      a first interface between said tunnel barrier and said first electrode; and
      a second interface between said tunnel barrier and said second electrode; and
   said tunnel barrier including said first and second interfaces defining a profile of said quantum mechanical barrier height within said tunnel barrier, said profile being asymmetrical with regard to a barrier symmetry area equidistant from said first and second interfaces;
   said tunnel barrier and said first and second electrodes defining a tunnel element having an electrical conductivity dependent upon a polarity of a measurement voltage $U_m$ applied between said first and second electrodes;
   said tunnel barrier having at least two barrier sections of at least two different barrier materials;
   said at least two different barrier materials having work functions differing by at least 0.1 eV; and
   said at least two barrier sections being disposed asymmetrically with respect to said barrier symmetry area.

2. The magnetoresistive tunnel element according to claim 1, wherein:
   said first electrode has a first ferromagnetic material with a work function $W_A$; and
   said second electrode has a second ferromagnetic material with a work function $W_B$.

3. The magnetoresistive tunnel element according to claim 2, wherein a difference between said work function $W_A$ and said work function $W_B$ is between 0.5 eV and 50 eV.

4. The magnetoresistive tunnel element according to claim 1, wherein:
   said first electrode has a first ferromagnetic material with a given work function; and
   said second electrode has a second ferromagnetic material with a work function different from said given work function.

5. The magnetoresistive tunnel element according to claim 1, wherein:
   said first and second electrodes and said at least two barrier sections are respectively provided as planar barrier layers disposed successively on one of said first and second electrodes; and
   another of said first and second electrodes is disposed on a first of said barrier layers.

6. The magnetoresistive tunnel element according to claim 1, wherein said first and second electrodes and said at least two barrier sections are respectively provided as planar barrier layers disposed successively on one another, one of said first and second electrodes being disposed as a bottom one of said barrier layers and another of said first and second electrodes being disposed as a top one of said barrier layers.

7. The magnetoresistive tunnel element according to claim 1, wherein said tunnel barrier has:
   a first barrier layer having a layer thickness $d_a$ of a first barrier material with a work function $W_{Ta}$; and
   a second barrier layer having a layer thickness $d_b$ of a second barrier material with a work function $W_{Tb}$.

8. The magnetoresistive tunnel element according to claim 7, wherein said barrier materials are materials selected from group consisting of metal oxides, mixed metal oxides, and metal sulfides.

9. The configuration magnetoresistive tunnel element according to claim 8, wherein said barrier materials are materials selected from a group consisting of aluminum oxides, tantalum oxides, hafnium oxides, nickel oxides, magnesium oxides, strontium titanium oxides, and zinc sulfide.

10. The magnetoresistive tunnel element according to claim 7, wherein said layer thickness $d_a$ is equal to said layer thickness $d_b$.

11. The magnetoresistive tunnel element according to claim 10, wherein:
   said layer thicknesses $d_a$ and $d_b$ are each approximately 2.5 nm thick; and
   one of said first and second barrier materials is zinc sulfide and another of said first and second barrier materials is tantalum oxide.

12. The magnetoresistive tunnel element according to claim 7, wherein:
   said layer thicknesses $d_a$ and $d_b$ are each approximately 1 nm thick; and
   one of said first and second barrier materials is aluminum oxide and another of said first and second barrier materials is tantalum oxide.

13. The magnetoresistive tunnel element according to claim 1, wherein said tunnel barrier has:
   a first barrier layer having a layer thickness $d_a$ of a first barrier material with a given work function; and
   a second barrier layer having a layer thickness $d_b$ of a second barrier material with, a work function different from said given work function.

14. The magnetoresistive tunnel element according to claim 13, wherein said layer thickness $d_a$ is equal to said layer thickness $d_b$.

15. The magnetoresistive tunnel element according to claim 14, wherein:

said layer thicknesses $d_a$ and $d_b$ are each approximately 2.5 nm thick; and
one of said first and second barrier materials is zinc sulfide and another of said first and second barrier materials is tantalum oxide.

16. The configuration magnetoresistive tunnel element according to claim 13, wherein:
said layer thicknesses $d_a$ and $d_b$ are each approximately 1 nm thick; and
one of said first and second barrier materials is aluminum oxide and another of said first and second barrier materials is tantalum oxide.

17. The magnetoresistive tunnel element according to claim 1, wherein said barrier materials are materials selected from group consisting of metal oxides, mixed metal oxides, and metal sulfides.

18. The magnetoresistive tunnel element according to claim 17, wherein said barrier materials are materials selected from a group consisting of aluminum oxides, tantalum oxides, hafnium oxides, nickel oxides, magnesium oxides, strontium titanium oxides, and zinc sulfide.

19. A magnetoresistive memory cell, comprising:
a memory layer defining a first electrode;
a reference layer defining a second electrode; and
a magnetoresistive tunnel element having:
  a tunnel barrier having a quantum mechanical barrier height therewithin, said tunnel barrier being disposed between said first and second electrodes and defining:
    a first interface between said tunnel barrier and said first electrode; and
    a second interface between said tunnel barrier and said second electrode; and
  said tunnel barrier including said first and second interfaces defining a profile of said quantum mechanical barrier height within said tunnel barrier, said profile being asymmetrical with regard to a barrier symmetry area equidistant from said first and second interfaces;
  said tunnel barrier and said first and second electrodes defining a tunnel element having an electrical conductivity dependent upon a polarity of a measurement voltage $U_m$ applied between said first and second electrodes;
  said tunnel barrier having at least two barrier sections of at least two different barrier materials;
  said at least two different barrier materials having work functions differing by at least 0.1 eV; and
  said at least two barrier sections being disposed asymmetrically with respect to said barrier symmetry area.

20. A memory cell array, comprising:
magnetoresistive memory cells each having:
a memory layer defining a first electrode;
a reference layer defining a second electrode; and
a magnetoresistive tunnel element having:
  a tunnel barrier having a quantum mechanical barrier height therewithin, said tunnel barrier being disposed between said first and second electrodes and defining:
    a first interface between said tunnel barrier and said first electrode; and
    a second interface between said tunnel barrier and said second electrode; and
  said tunnel barrier including said first and second interfaces defining a profile of said quantum mechanical barrier height within said tunnel barrier, said profile being asymmetrical with regard to a barrier symmetry area equidistant from said first and second interfaces;
  said tunnel barrier and said first and second electrodes defining a tunnel element having an electrical conductivity dependent upon a polarity of a measurement voltage $U_m$ applied between said first and second electrodes;
  said tunnel barrier having at least two barrier sections of at least two different barrier materials;
  said at least two different barrier materials having work functions differing by at least 0.1 eV; and
  said at least two barrier sections being disposed asymmetrically with respect to said barrier symmetry area;
a first interconnect layer having word lines respectively connected to said magnetoresistive memory cells;
a second interconnect layer having bit lines respectively connected to said magnetoresistive memory cells; and
said magnetoresistive memory cells disposed between said first interconnect layer and said second interconnect layer.

21. A memory device, comprising:
memory cell arrays each having;
  magnetoresistive memory cells each having:
    a memory layer defining a first electrode;
    a reference layer defining a second electrode; and
    a magnetoresistive tunnel element having:
      a tunnel barrier having a quantum mechanical barrier height therewithin, said tunnel barrier being disposed between said first and second electrodes and defining:
        a first interface between said tunnel barrier and said first electrode; and
        a second interface between said tunnel barrier and said second electrode; and
      said tunnel barrier including said first and second interfaces defining a profile of said quantum mechanical barrier height within said tunnel barrier, said profile being asymmetrical with regard to a barrier symmetry area equidistant from said first and second interfaces;
      said tunnel barrier and said first and second electrodes defining a tunnel element having an electrical conductivity dependent upon a polarity of a measurement voltage $U_m$ applied between said first and second electrodes;
      said tunnel barrier having at least two barrier sections of at least two different barrier materials;
      said at least two different barrier materials having work functions differing by at least 0.1 eV; and
      said at least two barrier sections being disposed asymmetrically with respect to said barrier symmetry area;
    a first interconnect layer having word lines respectively connected to said magnetoresistive memory cells;
    a second interconnect layer having bit lines respectively connected to said magnetoresistive memory cells; and
    said magnetoresistive memory cells disposed between said first interconnect layer and said second interconnect layer; and said memory cell arrays and said first and second interconnect layers form memory structures stacked one above the other.

22. A magnetoresistive tunnel element, comprising:

a first electrode;

a second electrode;

a tunnel barrier having a quantum mechanical barrier height therewithin, said tunnel barrier being disposed between said first and second electrodes and defining:
 a first interface between said tunnel barrier and said first electrode; and
 a second interface between said tunnel barrier and said second electrode;

a profile of said quantum mechanical barrier height within said tunnel barrier with inclusion of said first and second interfaces being asymmetrical with regard to a barrier symmetry area equidistant from said first and second interfaces;

said tunnel barrier and said first and second electrodes defining a tunnel element having an electrical conductivity dependent upon a polarity of a measurement voltage $U_m$ applied between said first and second electrodes;

said tunnel barrier having at least two barrier sections of at least two different barrier materials;

said at least two different barrier materials having work functions differing by at least 0.1 eV; and said at least two barrier sections being disposed asymmetrically with respect to said barrier symmetry area.

* * * * *